United States Patent [19]

Taylor et al.

[11] 4,223,277

[45] Sep. 16, 1980

[54] ELECTRICALLY ALTERABLE FIELD EFFECT TRANSISTOR AMPLIFIER CONFIGURATION

[75] Inventors: David L. Taylor; Stephen A. Harris, both of Melbourne, Fla.

[73] Assignee: Harris Corporation, Melbourne, Fla.

[21] Appl. No.: 973,668

[22] Filed: Dec. 27, 1978

Related U.S. Application Data

[63] Continuation-in-part of Ser. No. 861,331, Dec. 16, 1977, Pat. No. 4,153,883.

[51] Int. Cl.$^2$ ........................ H03F 3/18; H01L 25/00

[52] U.S. Cl. ........................................ 330/264; 29/586

[58] Field of Search .................... 330/207 P, 264, 277, 330/298; 29/584, 586, 577 C

[56] References Cited

U.S. PATENT DOCUMENTS

| | | | |
|---|---|---|---|
| 3,641,516 | 2/1972 | Castrucci et al. | 29/584 UX |
| 3,761,787 | 9/1973 | Davis et al. | 330/307 X |
| 3,930,304 | 1/1976 | Keller et al. | 29/586 X |
| 3,947,727 | 3/1976 | Stewart | 330/298 X |
| 4,015,212 | 3/1977 | Miyata | 330/264 |

*Primary Examiner*—James B. Mullins
*Attorney, Agent, or Firm*—Leitner, Palan, Lyman, Martin & Bernstein

[57] ABSTRACT

A field effect transistor amplifier for use as on the output buffer for semiconductor memories including an electrically alterable element added to an active pull up configuration to allow conversion between active pull up and open drain nonvolatile configurations reversibly or irreversibly. A fusible element or P-N junction device is electrically alterable for irreversible configuration conversion and an amorphous material element is electrically alterable for reversible and irreversible configuration conversion.

10 Claims, 10 Drawing Figures

ELECTRICALLY ALTERABLE FIELD EFFECT TRANSISTOR AMPLIFIER CONFIGURATION

CROSS-REFERENCE TO RELATED APPLICATIONS

This application is a continuation-in-part of application Ser. No. 861,331 filed Dec. 16, 1977, now U.S. Pat. No. 4,153,883.

BACKGROUND OF THE INVENTION

The present invention, is directed generally to amplifiers, and more specifically to an output buffer which is electrically alterable to be converted between active pull-up and open drain nonvolatile configurations.

The prior art has included convertible amplifiers which generally have mechanical switches such as manually operated switches or relays or transistor switches to select a desired configuration. These circuits have not been used in integrated circuits.

Integrated circuits having field effect transistor output buffers are commonly configured as open drain or active pull-up. The standard approach taken by semiconductor manufacturers is to include within the circuitry of the buffers, the components necessary to provide the active pull-up configuration and by means of a metal option create the open-drain configuration. Two metal masks are required to provide the simple option. Also, two sets of test programs are required at the final test area for all D.C. tests. All tests must separate open-drain from active pull-up configurations due to inevitable product mix at both the wafer, assembly and final test rescreen levels. This leads to serious logistics problems of maintaining product identity in the wafer fabrication process as well as in the final test areas. Thus there exists a need for a methodology of configuring amplifiers or output buffers in a single configuration which may be electrically altered after final testing to allow selection of a desired permanent configuration. The same problem exists for bipolar transistor output buffers with the necessity of providing push-pull or open collector configuration.

SUMMARY OF THE INVENTION

The present invention eliminates the problem of the prior art by providing a single configuration incorporating electrically alterable elements for selecting the output buffer configuration after testing. The output buffer is generally configured as an active pull-up amplifier having a pair of complementary field effect transistors with their source and drains connected in series between a pair of voltage supply terminals and their gates connected together. An electrically alterable element is provided between the output of the amplifier and the drain of one of the field effect transistors. Using a fusible element as the electrically alterable element, the buffer has an active pull-up configuration and is irreversibly electrically alterable to an open drain configuration. Using a P-N junction element as the electrically alterable element, the buffer has an open drain configuration and is irreversibly electrically alterable to an active pull-up configuration. Using an amorphous material element, the buffer is reversible electrically alterable between the two configurations.

The fusible element and the P-N junction device are electrically altered by grounding the output and raising the source voltage sufficiently to blow the fusible element or short the P-N element and thereby irreversibly convert the buffer configuration. The impedance state of the amorphous material element is electrically altered by raising the source voltage to a value consistent with the threshold of the amorphous element and applying a pulsed current sink to the output.

OBJECTS OF THE INVENTION

An object of the present invention is to provide a field effect transistor (FET) output amplifier having an electrically alterable element to permanently alter the configuration of the amplifier.

Another object is to reduce the product mix at the test stages by providing a singly configured FET amplifier which is electrically alterable to change configurations.

A further object of the invention is to reduce inventory requirements by providing an FET amplifier whose configuration may be determined permanently by the customer.

Still another object is to reduce photo mask inventory by providing a single FET amplifier electrically alterable to change between nonvolatile configurations.

A still further object of the invention is to provide an FET amplifier whose configuration may be changed which is compatible with integrated circuit technology.

Other objects, advantages, and novel features of the present invention will become apparent from the following detailed description of the present invention when considered in conjunction with the accompanying drawings.

DESCRIPTION OF THE PREFERRED EMBODIMENTS

Figure 1:
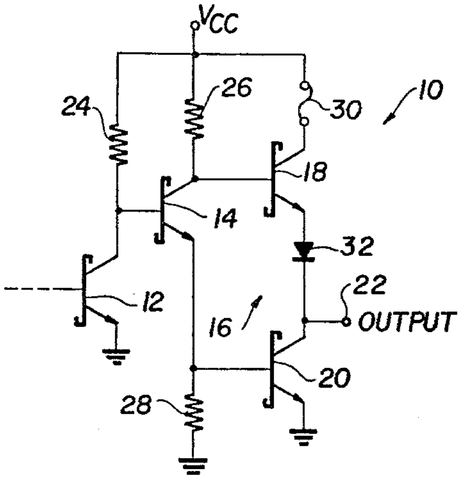
FIG. 1 is a schematic diagram of a bipolar transistor amplifier incorporating the principles of the present invention and having a fusible element in the collector circuit.

FIG. 1, which illustrates the preferred embodiment of an amplifier having an electrically alterable element therein, includes an input or preamplifier transistor 12, a phase splitting transistor 14, and a push-pull output amplifier stage 16. Transistor 18 being in an emitter follower configuration and transistor 20 being in a common emitter configuration comprise the push-pull amplifier 16. The output of the push-pull stage 16 and the total buffer amplifier 10 is output terminal 22. Biasing resistors 24, 26, and 28 and diode 32 are provided. Connected in the collector circuit of transistor 18 of the push-pull stage is a fusible element 30. Buffer amplifier 10 as depicted is in a push-pull configuration. Transistors 12, 14, 18, and 20 are illustrated as Schottky bipolar transistors.

In order to convert the push-pull configuration of output amplification stage, 16, a signal is applied to the base of transistor 12 to turn it on, the output 22 is grounded and the collector voltage ($V_{CC}$) is raised sufficiently to cause a voltage to appear across fusible element 30 so as to destroy or blow the fusible element 30. With the fusible element 30 having a resistance of approximately 150 ohms, raising the collector voltage $V_{CC}$ to approximately 12 volts will cause approximately 10 volts to appear across the fuse, and destroy, open, or blow the fusible element 30. By forming an open circuit in the collector circuit of transistor 18, the buffer 10 and more specifically output stage 16, is converted to an open collector configuration.

Figure 2:
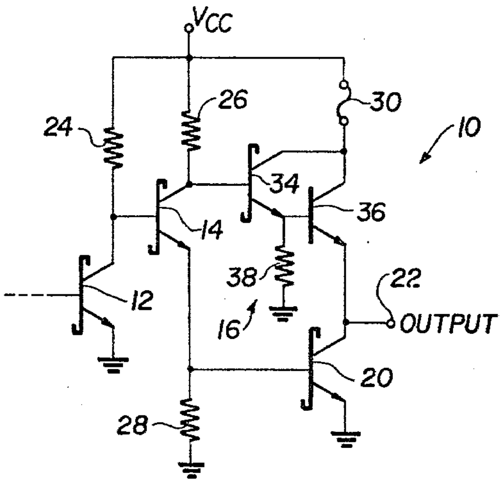
FIG. 2 is a schematic diagram of a bipolar transistor amplifier similar to that of FIG. 1 including a Darlington amplifier stage.

FIG. 2 illustrates a modification of buffer 10 wherein the emitter follower transistor 18 of the push-pull stage 16 has been replaced by a Darlington amplifier stage. Transistor 34 and 36 and biasing resistor 38 form the Darlington amplifier. The diode 32 has been eliminated. The operation and electrical alteration of buffer 10 with the Darlington amplifier stage as illustrated in FIG. 2 is identical to that of the buffer illustrated in FIG. 1. It should be noted that transistor 34 is a Schottky bipolar transistor and a transistor 36 is a bipolar transistor. The buffer 10 of FIGS. 1 and 2 having the fusible element 30 in the collector circuit only produce, upon destruction of the fusible element, a substantially open collector configuration by reducing the AC or DC currents considerably.

Figure 3:
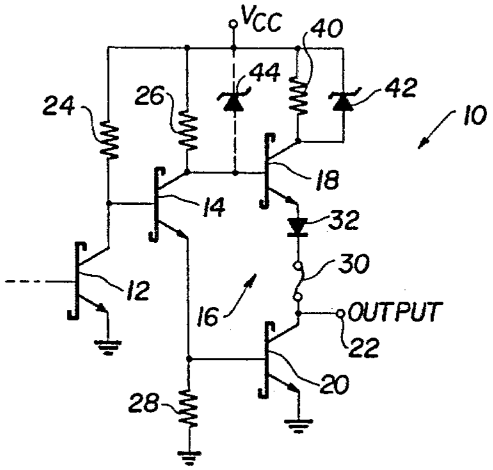
FIG. 3 is a schematic diagram of a bipolar transistor amplifier incorporating the principles of the present invention and having a fusible element in the emitter circuit.

Another buffer 10 is illustrated in FIG. 3 wherein the fusible element 30 is in the emitter circuit of the emitter follower transistor 18 of the push-pull stage 16. A biasing resistor 40 is added to the collector circuit of transistor 18 and a zener diode 42 is connected across the biasing resistor 40. If desired, an additional zener diode 44 may be connected between the base of transistor 18 and the collector bias voltage $V_{CC}$, as illustrated in phantom. The electrical alteration of the buffer 10 of FIG. 3 requires only the grounding of output 22 and raising the collector voltage $V_{CC}$. The buffer 10 of FIG. 3 is normally in a push-pull configuration and upon destruction or opening of fusible element 30, the buffer 10 and more specifically at the output stage 16 is converted to a true open collector configuration.

Figure 4:
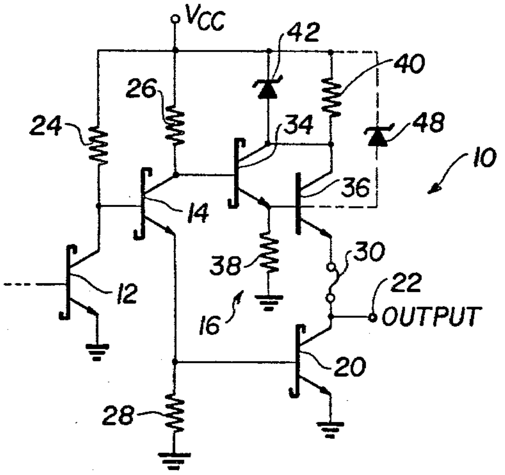
FIG. 4 is a schematic diagram of a bipolar transistor amplifier similar to that of FIG. 3 including a Darlington amplifier stage.

Buffer 10 as illustrated in FIG. 4 is similar to that of FIG. 3 except that the emitter follower transistor 18 is replaced by Darlington amplifier including transistors 34, 36 and biasing resistor 38. Diode 32 has been eliminated and if desired an additional zener diode 48, as illustrated in phantom, may be included between the collector voltage supplied $V_{CC}$ and the base of output transistor 36 of the Darlington pair. The buffer circuit 10 of FIG. 4 operates and is electrically altered identically to buffer 10 of FIG. 3. Although the buffers of FIGS. 3 and 4 provide a true open collector configuration upon destruction of the fusible element 30, whereas the buffers of FIGS. 1 and 2 provide a substantially open collector configuration, the buffers of FIGS. 3 and 4 having the disadvantage of producing a slight deterioration of the $V_{OH}$. For an $I_{OH}$ of $-2$ milliamperes, the degradation is small or approximately 100 millivolts. For high $I_{OH}$ specifications, degradation may not be satisfactory under extreme temperatures and voltages. The circuits of FIGS. 3 and 4 with the fusible element 30 in the emitter circuit is designed specifically for low value fuses. To program fusible element 30, which is for example 50 ohms, the collector voltage $V_{CC}$ is raised to approximately 12 volts while the output 22 is grounded.

Figure 5:
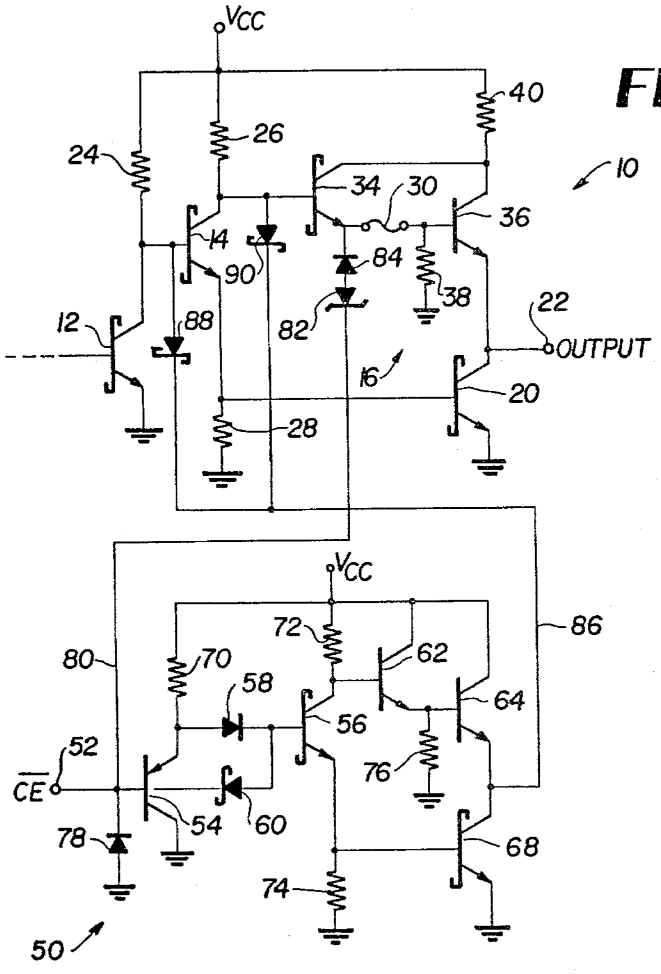
FIG. 5 is a schematic diagram of a bipolar transistor amplifier incorporating the principles of the present invention and having a fusible element in a Darlington amplifier stage.

Still another circuit for buffer amplifier 10 is illustrated in FIG. 5 including a Darlington amplifier having transistors 34, 36 and biasing resistor 38. Fusible element 30 is connected between the emitter of transistor 34 and the base of transistor 36 of the Darlington amplifier. To electrically alter or to destroy or open the fusible element 30, an electrical alteration circuit 50 is included. The input 52 of the electrical alteration circuit 50 receives the chip enable signal $\overline{CE}$ and transmits it to the base of transistor 54. The base of transistor 56 is connected to transistor 54 through diode 58 and Schottky diode 60. The output of phase splitting transistor 56 is fed to a Darlington pair of transistors 62, 64 and the other member of a push-pull configuration or output transistor 68. Biasing resistors 70, 72, 74, and 76 are provided in the electrical alteration circuit 50. Diode 78 connects the input 52 to ground.

The input terminal 52 is also connected through line 80, zener diode 82, and diode 84 to the emitter of transistor 34 and the fusible element 30. The output of the push-pull stage of the electrical alteration circuit is connected by a line 86 and Schottky diode 88 to the base of the phase splitting transistor 14 of buffer 10, and through Schottky diode 90 to the base of the transistor 34 of buffer 10.

As with FIGS. 1-4, the buffer 10 of FIG. 5 is in a push-pull configuration. To electrically alter the fusible element 30 to convert the configuration from a push-pull to an open-collector configuration, the signal input 52 of the electrical alteration circuit 50 is raised to approximately 15 volts and the output 22 of the buffer 10 is grounded. This condition applies approximately 6.5 volts across a fusible element 30, of approximately 150 ohms, and causes it to blow or form an open circuit. When the fusible element 30 is blown, the output buffer is converted from a push-pull to an open collector configuration.

The buffers and amplifiers of FIGS. 1-5 are configured in a push-pull configuration and include fusible elements which may be programmed to convert permanently the buffer amplifier to an open collector configuration. Another circuit which embodies the principle of the present invention is illustrated in FIGS. 6 and 7, wherein an electrically alterable element is included in a buffer amplifier having an open collector configuration and, by electrical alteration of the electrically alterable element, the configuration is permanently converted to a push-pull configuration.

Figure 6:
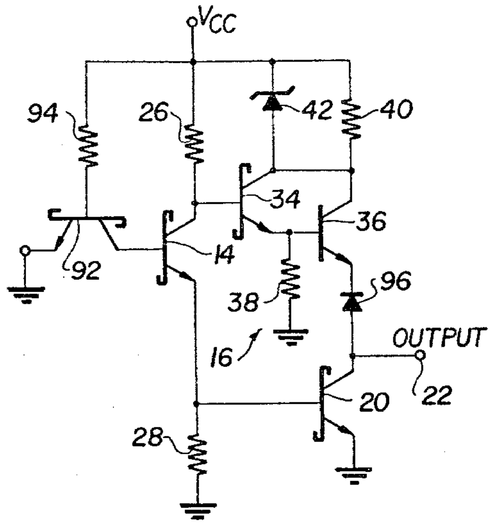
FIG. 6 is a schematic diagram of a bipolar transistor amplifier incorporating the principles of the present invention and having a diode in the emitter circuit as the electrically altered element.

As illustrated in FIG. 6, the input or preamplifier stage includes a transistor 92 connected in a common base configuration having a biasing resistor 94. The phase splitting transistor 14 is connected thereto and the output stage is connected in a generally push-pull configuration having a Darlington amplifier stage 34, 36 connected in an emitter follower configuration and a common emitter configured transistor 20. The output of the buffer is at 22. Other biasing resistors 26, 28, 38, and 40 are provided. The electrically alterable element of FIG. 6 is a PN junction device or diode 96 having its anode connected to the output 22 and its cathode connected to the emitter of transistor 36. This connection of diode 96 prevents normal conduction through the Darlington amplifier so that the buffer of FIG. 6 has a generally open collector configuration. Electrically alterable element or diode 96 is programmed by grounding the output 22 and raising the collector voltage $V_{CC}$ to approximately 16 volts. This will apply a high current through diode 96 to thereby alter its characteristics and create a short across the diode. The shorting of diode 96 permanently converts the buffer amplifier from an open collector configuration to a push-pull configuration. A zener diode 42 is connected across biasing resistor 40 and aids in the electrical alteration of the electrically alterable element 96.

Figure 7:
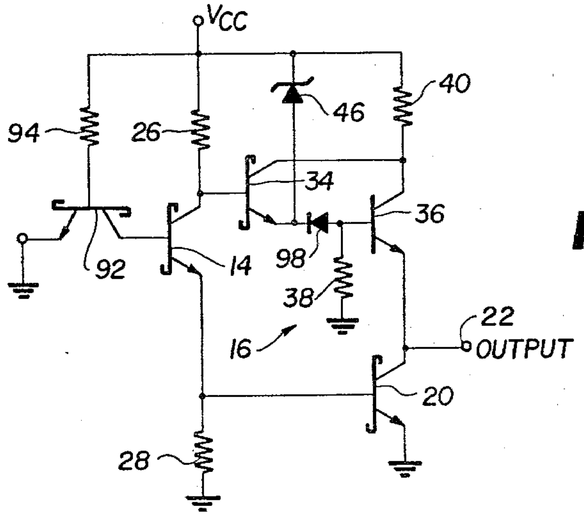
FIG. 7 is a schematic diagram of a bipolar transistor amplifier incorporating the principles of the present invention and having a diode in a Darlington amplifier stage.

Another circuit for a buffer amplifier having initially an open collector configuration permanently converted by electrical alteration to a push-pull configuration is illustrated in FIG. 7. The circuit of FIG. 7 is similar to FIG. 6 except that the electrically alterable P-N junction or diode is illustrated as 98 and interconnects the emitter of transistor 34 to the base of transistor 36 of the Darlington amplifier. Also, the zener diode 42 is replaced by the zener diode 46 which aids in the electrical alteration of the diode 98. The operation and electrical alteration function of the buffer amplifier in FIG. 7 is similar or identical to the operation of the buffer amplifier of FIG. 6. The only limitation of using electrically alterable P-N junction devices to convert the configuration of the output amplifier is that the transistor geometries must be adjusted to insure that the devices through which the high current must flow to short the diode are not damaged.

The electrically alterable PN junction 96 and 98 in FIGS. 6 and 7 are illustrated as diodes. A preferred configuration for these diodes is to short the collector and base of a transistor. The diode thus formed would be the emitter-base junction or diode. The diodes 96 and 98 in FIGS. 6 and 7 respectively may be replaced by other semiconductor devices which are electrically alterable.

Figure 8:
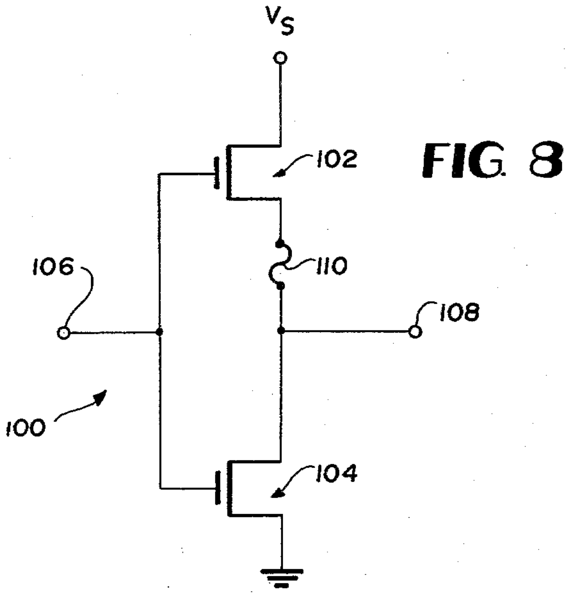
FIG. 8 is a schematic diagram of an FET amplifier incorporating the principles of the present invention and having a fusible element as the electrically alterable element.
Figure 10:
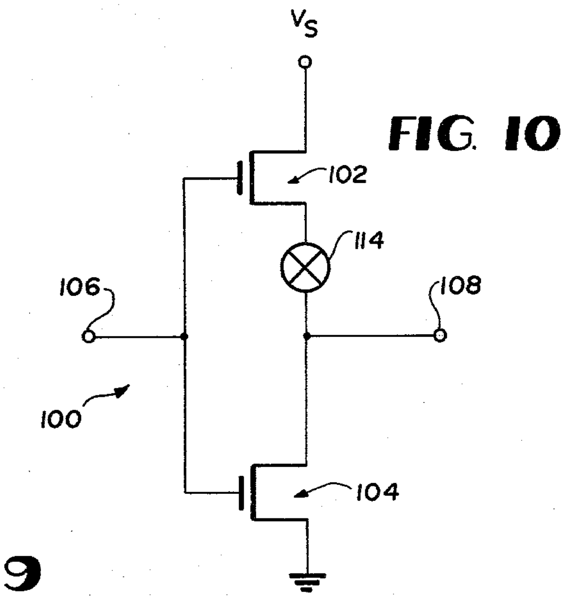
FIG. 10 is a schematic diagram of an FET amplifier incorporating the principles of the present invention and having an amorphous material element as the electrically alterable element.
Figure 9:
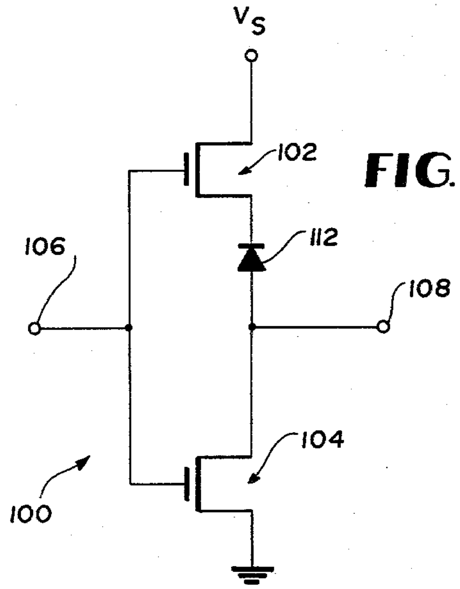
FIG. 9 is a schematic diagram of an FET amplifier incorporating the principles of the present invention and having a diode as the electrically alterable element.

Field effect transistor (FET) buffers having reversible and irreversible, nonvolatile, electrically alterable elements for configuration conversion between active pull-up and open drain configurations are illustrated in FIGS. 8, 9 and 10. The FET buffer or amplifier 100 includes first and second FET's 102 and 104, illustrated as P and N channel respectively, connected in series at their drain between the voltage supply terminals $V_S$ and ground. Their gates are connected together to form the input 106 and the output 108 is at the drains. An electrically alterable element separates FET 102 and the output 108. The condition or state of the electrically alterable device determines the buffer configuration.

In FIG. 8, the electrically alterable device is illustrated as fusible element 110. The buffer is configured as active pull-up. The configuration is irreversibly converted to an open drain configuration by blowing the fusible element 110. To accomplish this, the supply voltage $V_S$ is raised to approximately 12 volts and the output 108 is grounded. This significantly increases the gate to source voltage of pull-up FET 102 and this increases the current through FET 102 and fusible element 110. Once the fusible element is blown, the buffer is irreversibly converted to an open drain configuration. Since the fusible link can readily be a low resistance (approximately 50 ohms), no significant deterioration of the dynamic resistance of the P-channel FET is experienced (400–800 ohms impedance would be typical for the P-channel device). Since the P-channel device is statically off, no change in the VOH characteristic is observed.

In FIG. 9, the electrically alterable element is a P-N junction device or diode 112 having its anode connected to the output 108 and its cathode connected to the drain of FET 102. The diode 112 prevents normal conduction through FET 102 so that the buffer has a generally open drain configuration. The configuration is irreversibly converted to an active pull-up by shorting the diode 112. To accomplish this, the supply voltage $V_S$ is raised to approximately 12 volts and the output 108 is grounded. The resulting high current through diode 112 shorts it. Once the diode 112 is shorted, the buffer is irreversibly converted to an active pull-up configuration.

In FIG. 10, the electrically alterable element is an amorphous material element 114 which can be reversibly altered between high and low, nonvolatile impedence states. If amorphous element 114 is in the high impedance state, the buffer would be in an open drain configuration and if the amorphous element is in the low impedance state, the buffer would be in an active pull-up configuration. The amorphous semiconductor element may be manufactured in either impedance state and electrically altered to the other to reversibly convert the nonvolatile configuration of the buffer.

The amorphous material device may be a tellurium based chalcogenide glass having a high impedance state of, for example, approximately ten megohm and a low impedance state of, for example, approximately 200 ohms. The amorphous device is electrically altered by raising $V_{CC}$ to a value consistent with the threshold value of the amorphous element (for example 12 to 18 volts) and applying a pulsed current sink to the output. The characteristics of the current pulse or pulses will determine the impedance state of the amorphous element.

The amorphous element is a reversible, nonvolatile electrically alterable element, although certain amorphous material devices may be manufactured in a high impedance state and irreversibly electrically altered to a low impedance state. The reversibility provides a distinct advantage over the irreversible fuse and P-N junction elements of FIGS. 8 and 9. Thus the buffer of FIG. 10 may be switched between an active pull-up and open drain configuration and nonvolatily hold that configuration until subsequently electrically altered. It should be noted that nonvolatile connotes that once the amorphous element is electrically set in an impedance state, it will retain that state without any biasing.

The field effect transistor buffers FIGS. 8, 9 and 10, may include junction as well as insultated gate devices and enhancement as well as depletion devices. The fusible elements 110 may be polycrystalline silicon inherent within FET processing or a metallic link.

It should be noted that both techniques of using a fusible element, like 30, or a virtually open circuit semiconductor device which may be shorted, like 96 and 98, are compatible with standard bipolar and field effect transistor technology. Transistors and zener diode breakdown voltages required are inherent in the process technology. The use of electrically alterable devices to alter the configuration of an output amplifier can be used in electrically alterable product types, for example, PROMS or ROMS. The electrically alterable buffers serve primarily as an output buffer for a semiconductor memory and bipolar integrated array.

The use of fuses, P-N junctions and amorphous material devices are but examples of the type of electrically alterable elements which may be used and other electrically alterable elements from the PROM technology may be used.

From the preceding description of the preferred embodiments, it is evident that the objects of the invention are obtained and though the invention has been described and illustrated in detail, it is to be clearly understood that the same is by way of illustration and example only and is not to be taken by way of limitation. The spirit and scope of the invention is to be limited only by the terms of the appended claims.

What is claimed:

1. In an active pull-up field effect transistor amplifier having a P-channel device and an N-channel device connected in series between a pair of voltage supply terminals, their gates forming the input of the amplifier and their drains forming the output of the amplifier, the improvement comprising:

a fusible means of substantially neglegable resistance only in the drain circuit of said P-channel device for irreversibly converting said amplifier from an active pull-up to an open drain configuration upon being electrically altered.

2. In an active pull-up field effect transistor amplifier having a P-channel device and an N-channel device connected in series between a pair of voltage supply terminals with their gates forming the input of the amplifier and their drains forming the output of the amplifier, the improvement comprising:

a P-N junction means in the drain circuit of said P-channel device for irreversibly converting said amplifier from an open drain to an active pull-up configuration upon being electrically altered.

3. In an active pull-up field effect transistor amplifier having a P-channel device and an N-channel device connected in series between a pair of voltage supply terminals, their gates forming the input of the amplifier and their drains forming the output of the amplifier, the improvement comprising:

means electrically alterable between nonvolatile high and low impedance states for reversibly converting said amplifier between said active pull-up and an open drain nonvolatile configurations.

4. The amplifier according to claim 3 wherein said means is formed from amorphous material.

5. A method of programming a field effect transistor amplifier configuration comprising the steps of:

connecting a P-channel and N-channel field effect transistor in series between a pair of voltage supply terminals in an active pull-up configuration with their gates forming the input of the amplifier and their drains forming the output of the amplifier;

connecting an electrically alterable means in the drain circuit of said P-channel device in a first nonvolatile state for causing said amplifier to be in either an active pull-up or open drain nonvolatile configuration and being electrically alterable to a second nonvolatile state to convert said amplifier to the other of said active pull-up or open drain nonvolatile configurations; and creating a voltage across or current through said electrically alterable means to alter its electrical characteristics to said second nonvolatile state.

6. The method of claim 5 wherein said electrically alterable means includes a fusible element to cause said amplifier to have an active pull-up configuration and said electrical altering blows said fusible element to cause said amplifier to have an open drain configuration.

7. The method of claim 5 wherein said electrically alterable means includes a diode connected to said P-channel device to cause said amplifier to have an open drain configuration and said electrical altering shorts said diode to cause said amplifier to have an active pull-up configuration.

8. The method of claim 5 wherein said electrical altering includes grounding the output of said amplifier and increasing the P-channel device's gate to source biasing voltage sufficient to irreversibly alter the electrical characteristics of said electrically alterable means.

9. The method of claim 5 wherein said programmable means includes an amorphous material element and said electrical altering alters the impedance state of said amorphous element to convert said amplifier between said active pull-up and open drain configurations.

10. The method of claim 9 wherein said electrically altering step includes increasing the P-channel's gate to source voltage and applying a current to the output of said amplifier sufficiently to alter the impedance state of said amorphous material element.

* * * * *